United States Patent
Kanth et al.

(10) Patent No.: US 12,119,316 B2
(45) Date of Patent: Oct. 15, 2024

(54) PATTERNED AND PLANARIZED UNDER-BUMP METALLIZATION

(71) Applicant: NXP USA, Inc., Austin, TX (US)

(72) Inventors: Namrata Kanth, Mesa, AZ (US); Paul Southworth, Groesbeek (NL); Scott M. Hayes, Chandler, AZ (US); Dwight Lee Daniels, Phoenix, AZ (US); Yufu Liu, Taoyuan (TW); Jeroen Johannes Maria Zaal, Nijmegen (NL); Cheong Chiang Ng, Cheras (MY)

(73) Assignee: NXP USA, Inc., Austin, TX (US)

( * ) Notice: Subject to any disclaimer, the term of this patent is extended or adjusted under 35 U.S.C. 154(b) by 267 days.

(21) Appl. No.: 17/664,113

(22) Filed: May 19, 2022

(65) Prior Publication Data
US 2023/0378106 A1 Nov. 23, 2023

(51) Int. Cl.
*H01L 23/00* (2006.01)
(52) U.S. Cl.
CPC ............. *H01L 24/05* (2013.01); *H01L 24/03* (2013.01); *H01L 24/16* (2013.01); *H01L 24/81* (2013.01); *H01L 2224/0348* (2013.01); *H01L 2224/0361* (2013.01); *H01L 2224/03622* (2013.01); *H01L 2224/03916* (2013.01); *H01L 2224/05011* (2013.01); *H01L 2224/05015* (2013.01); *H01L 2224/05017* (2013.01); *H01L 2224/05018* (2013.01); *H01L 2224/05551* (2013.01); *H01L 2224/05555* (2013.01); *H01L 2224/05557* (2013.01); *H01L 2224/05558* (2013.01);
(Continued)

(58) Field of Classification Search
CPC ......... H01L 24/05; H01L 24/03; H01L 24/16; H01L 24/81; H01L 2224/0348; H01L 2224/0361; H01L 2224/03622; H01L 2224/03916; H01L 2224/05011; H01L 2224/05015; H01L 2224/05017; H01L 2224/05018; H01L 2224/05551; H01L 2224/05555; H01L 2224/05557; H01L 2224/05558; H01L 2224/05573; H01L 2224/05576; H01L 2224/16227; H01L 2224/81203; H01L 2224/81815; H01L 2924/35121; H01L 2224/0401
See application file for complete search history.

(56) References Cited

U.S. PATENT DOCUMENTS 6,077,726 A 6/2000 Mistry et al.
6,787,903 B2 9/2004 Yang
(Continued)

FOREIGN PATENT DOCUMENTS

JP H 0513418 A 1/1993

*Primary Examiner* — Douglas W Owens
(74) *Attorney, Agent, or Firm* — Jonathan J. Sapan

(57) ABSTRACT

An electronic device substrate with a substantially planar surface formed from an electrically non-conductive material is provided with one or more metalized pads on the substantially planner surface. Each of the one or more metalized pads is surrounded by and coplanar with the first electrically nonconductive material along an outer boundary of the metalized pad. The metalized pad is patterned such that portions of the metalized pad form metalized fingers that extend radially from the outer boundary of the metalized pad in an interdigitated arrangement with the first electrically nonconductive material. The metalized pad has a solderable surface.

18 Claims, 10 Drawing Sheets

(52) U.S. Cl.
CPC ............... *H01L 2224/05573* (2013.01); *H01L 2224/05576* (2013.01); *H01L 2224/16227* (2013.01); *H01L 2224/81203* (2013.01); *H01L 2224/81815* (2013.01); *H01L 2924/35121* (2013.01)

(56) References Cited

U.S. PATENT DOCUMENTS

| | | |
|---|---|---|
| 7,968,445 B2 | 6/2011 | Lin et al. |
| 9,871,013 B2 * | 1/2018 | Tsai ..................... H05K 1/111 |
| 10,083,926 B1 | 9/2018 | Kent et al. |
| 10,331,993 B1 | 6/2019 | Koepp et al. |
| 2004/0041393 A1 | 3/2004 | Lee |
| 2004/0115902 A1 | 6/2004 | Hanaoka |
| 2004/0192024 A1 | 9/2004 | Ito |
| 2005/0242427 A1 | 11/2005 | Yang |
| 2007/0184643 A1 | 8/2007 | Rinne |
| 2011/0316154 A1 | 12/2011 | Matsumoto |
| 2013/0037933 A1 | 2/2013 | Jergovic et al. |
| 2013/0147034 A1 | 6/2013 | Chen |
| 2013/0241071 A1 * | 9/2013 | Hsieh ..................... H01L 24/11 257/E23.068 |
| 2014/0131882 A1 | 5/2014 | Law et al. |
| 2020/0035585 A1 | 1/2020 | Abraham et al. |
| 2022/0352133 A1 * | 11/2022 | Luan ..................... H01L 24/48 |

* cited by examiner

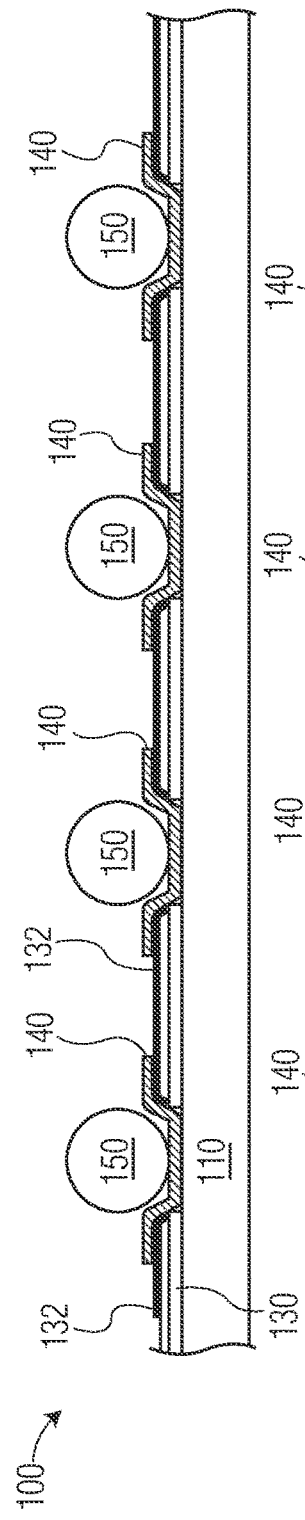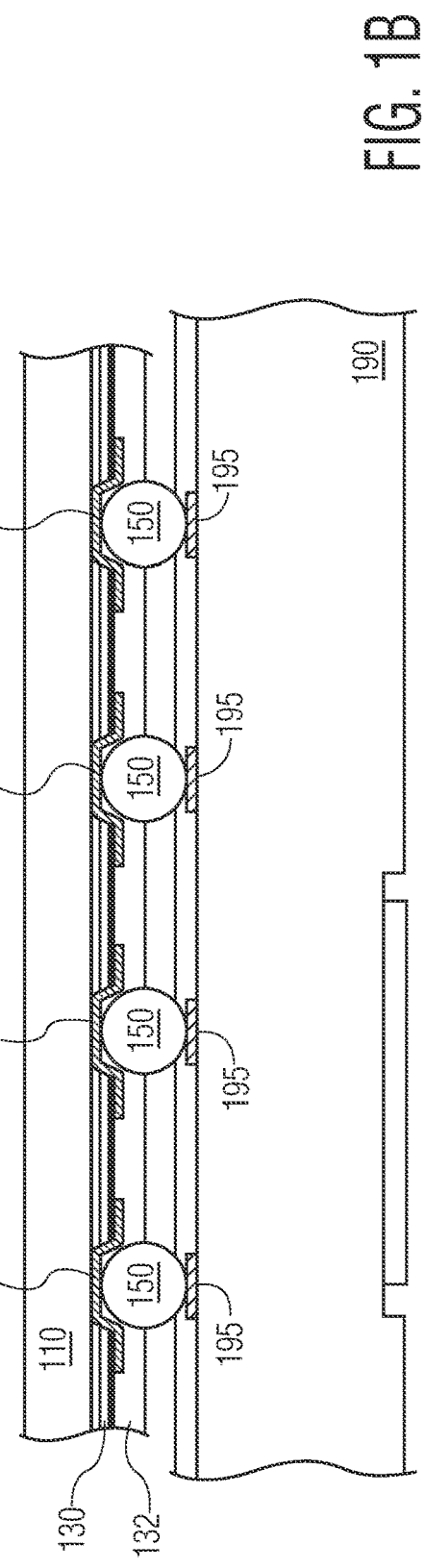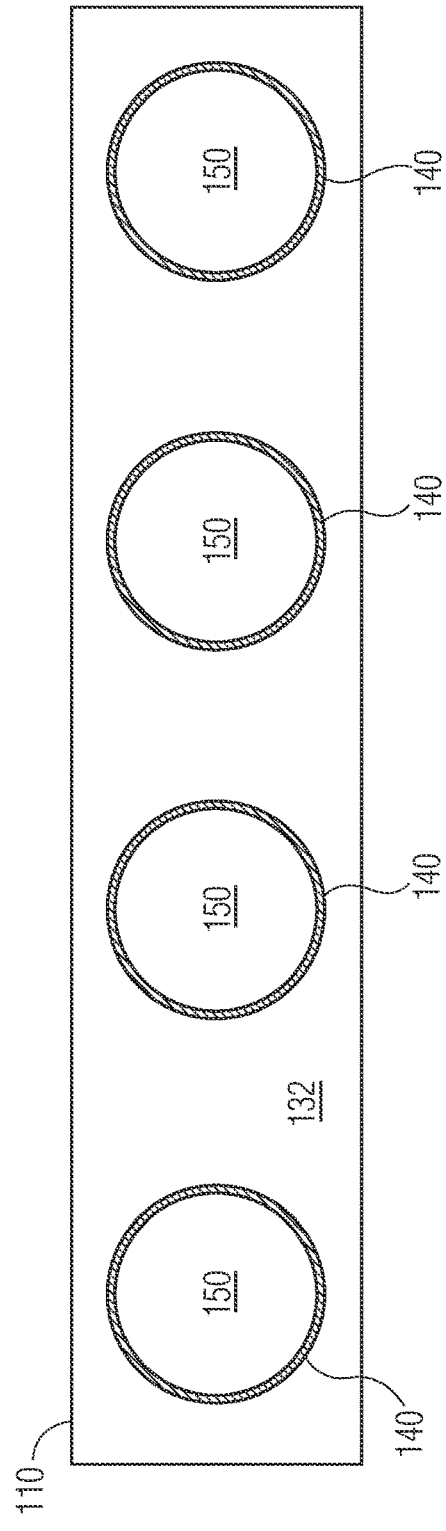

PATTERNED AND PLANARIZED UNDER-BUMP METALLIZATION

FIELD OF THE INVENTION

Embodiments of the subject matter described herein relate to structures and methods for flip-chip bonding of electronic devices.

BACKGROUND OF THE INVENTION

In flip-chip bonding a semiconductor die is provided with metal surface contacts disposed at the bottom of openings in a layer of passivation material that protects the surface of the die. Additional passivation materials and metalized structures are added to create external metal pads surrounded by passivation material such that the surface of the semiconductor die is completely covered and protected. The external metal pads are configured to allow selective bonding of solder materials to the external metal pads, resulting in solder balls or "bumps" on a top surface of the die. Semiconductor die having such solder bumps may then be inverted and bonded face-down to pads on a circuit board or other surface via the solder bumps.

SUMMARY OF THE INVENTION

In an example embodiment, an electronic device substrate is provided. The substrate includes a repassivation material layer having a substantially planar surface formed on the substrate from a first electrically nonconductive material. The substrate also includes a metalized pad surrounded by and coplanar with the first electrically nonconductive material along an outer boundary of the metalized pad. The metalized pad has a solderable surface and electrically contacts an electrical contact pad on the substrate beneath the metalized pad.

In an example embodiment, a method of fabricating a semiconductor device is provided. The method includes forming a repassivation material layer having a substantially planar surface on a substrate from a first electrically nonconductive material above a substrate having an electrical contact pad. The method also includes forming an aperture in the repassivation material layer that exposes an electrical contact pad on the substrate. The method also includes forming, within the aperture, a metalized pad that is surrounded by and coplanar with the repassivation material layer along an edge of the aperture, wherein the metalized pad has a solderable surface and electrically contacts the electrical contact pad.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIG. 1A shows example semiconductor substrate provided with solder bumps suitable for flip-chip bonding of the substrate to another substrate such as a printed circuit board.

FIG. 1B shows the substrate of FIG. 1A bonded to another substrate (such as a printed circuit board via the solder bumps of FIG. 1A.

FIG. 10 is a top view of the substrate of FIG. 1A showing the solder bumps and surrounding metalized pads.

DETAILED DESCRIPTION

Figure 2:
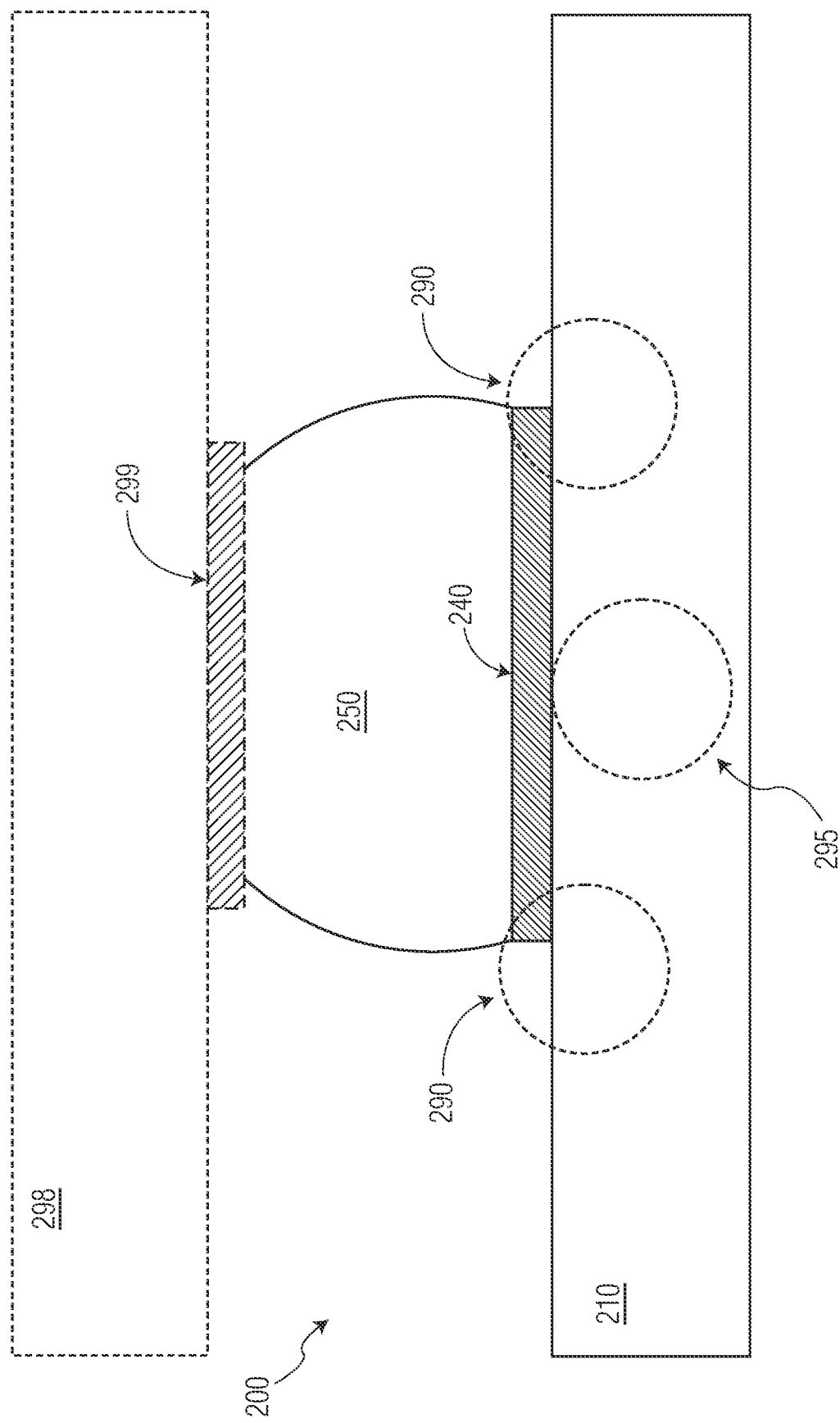
FIG. 2 shows a cross-sectional view of a solder bump bonded to metalized pad on a semiconductor substrate illustrating areas of tensile and compressive stresses formed in the solder bump and the substrate following bonding of the solder bump to the metalized pad on the substrate and bonding of the substrate to another substrate (such as a printed circuit board) via the solder bump.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

FIG. 1A shows an example environment 100 in which substrate 110 (e.g., an electronic device substrate such as a semiconductor die) provided with metalized pads 140 disposed within and above an electrically insulating passivation material 130 and so-called repassivation material 132. The substrate 110 is further provided with volumes of soldering material (solder bumps 150) which are metallurgically bonded (and as such, electrically coupled) to the metalized pads 140. The substrate 110 is protected by a passivation material 130 which can be selectively patterned to allow the deposition of electrical contact pads (not shown) or to expose previously formed contacts, leaving the rest of the substrate protected. A second passivation layer (the repassivation material 132) is typically formed above a layer of the passivation material 130 and has a lower modulus of elasticity (Young's modulus) than the passivation material 130. This can be desirable in substrates intended to be bonded to chip carriers or other structures in order to reduce the risk of damage to the substrate when pressure is applied during bonding processes as discussed further below.

As shown, the metalized pads have a topography that forms recessed "cups" with edges that are disposed over the passivation material 130 and the repassivation material 132, within which the solder bumps 150 rest on top of the substrate 110. These recessed area can be useful to keep solid beads in place after being placed on the substrate 110 (prior to heating the substrate 110 to reflow the solder), As illustrated, the substrate 110 may be rotated such that the solder bumps 150 face another substrate 190 having metalized pads 195 to which the solder bumps 150 may be metallurgically bonded (e.g., by heating and reflowing of the solder bumps 150), thereby bonding (and electrically coupling) the metalized pads 140 of the substrate 110 to corresponding metalized pads 195 of the substrate 190. As an example, the substrate 110 may be a semiconductor die configured to be bonded (and also electrically coupled) to a printed circuit board in order to integrate circuitry within the substrate 110 with other circuitry bonded to the substrate 190 or otherwise electrically coupled to the substrate 190. FIG. 1C shows a plan view of the portion of the substrate 110 shown in FIG. 1A. The solder bumps 150 of FIG. 1A can be seen disposed within the boundaries of the metalized pads 140 which are surrounded by the repassivation material 132. It will be understood that the illustrations described above are schematic in nature and do not necessarily represent the actual shape of solder bumps once properly bonded to a substrate. For instance, it will be understood that once sufficiently heated, a solder bump will tend to melt and wet the surface of a metalized pad on which it rests, similarly to the solder bump depicted in FIG. 2.

FIG. 2 depicts a cross-section of an example of a known structure 200 in which solder bump 250 (e.g., a solder bump 150) that is metallurgically bonded to a metalized pad 240 on a substrate 210 and to another substrate 298 (e.g., a printed circuit board) via a metalized pad 299 on that substrate. In a representative process, the soldering material forming the solder bump 250 may be placed on top of the metalized pad 240 in solid form (e.g., as pellet or ball of solder). The substrate 210 may then be heated to a suitable reflow temperature (for instance 220° C., as a nonlimiting example), whereupon the solder flows causing its shape to conform to the geometry of the underlying metalized pad. The solder and the substrate then cool to ambient temperature, whereupon the solder material solidifies, metallurgically bonding the soldering material to the substrate 210 and forming the solder bump 250 as shown. The entire structure may then be bonded to another substrate (e.g., the substrate 298 shown in FIG. 2) by way of one or more solder bumps 250. In such an example structure, mechanical stresses are induced as a solder bump 250 and the substrate 210 coo after being heated during the bonding process. In the example structure 200 and related structures, areas of high tensile stress within the substrate 210 will tend to form in the regions 290 beneath the edges of the solder bump 250 while areas of high compressive stress will tend to form in the die in the region 295 beneath the center of the solder bump 250 as wells as tensile stresses in the solder bump itself in the vicinity of the regions 290, 295. As an example, such stresses can be undesirable because they can result in altered performance of electronic devices within the die if they are too close to solder bump 250. It will be understood that the solder bump 250 is depicted schematically for purposes of illustration and that the exact shape of a solder bump used to bond two substrates may differ from the shape of the solder bump 250 as shown in FIG. 2.

Figure 3A:
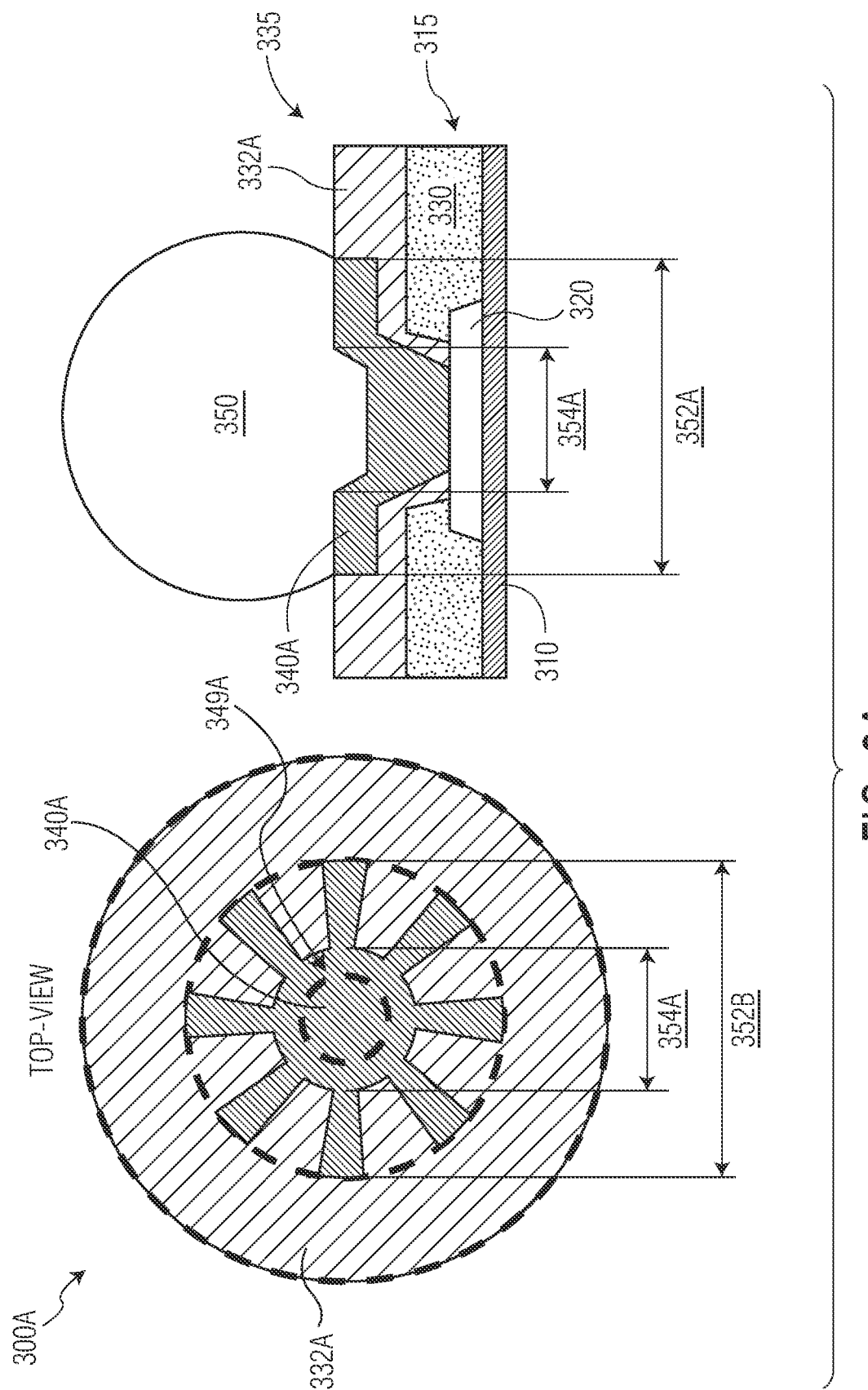
FIG. 3A shows a schematic plan view and a schematic cross-sectional view of a portion of an electronic device substrate provided with a patterned metalized pad configured to be bonded to a solder bump according to embodiments herein.
Figure 3B:
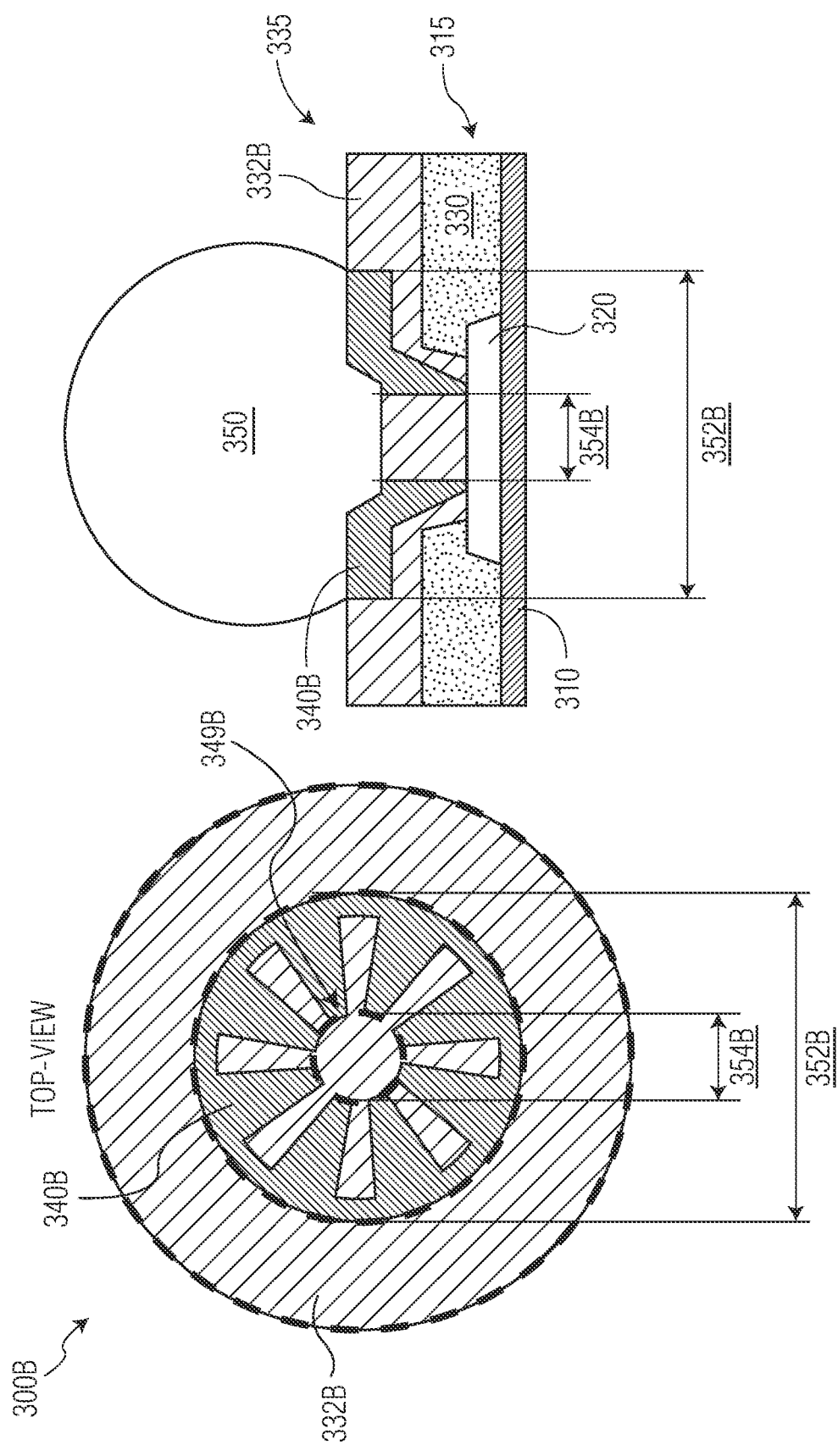
FIG. 3B shows a schematic plan view and a schematic cross-sectional view of a portion of an electronic device substrate provided with another type patterned metalized pad configured to be bonded to a solder bump according to embodiments herein.

Accordingly, as illustrated in FIG. 3A and FIG. 3B, embodiments herein include structures and methods to provide electronic device substrates with metalized pads which are configured and arranged to reduce mechanical stresses at the interface between an electronic device substrate and solder bumps which are metallurgically bonded to such substrates. As will be explained below in connection with FIG. 6A, FIG. 6B, and FIG. 6C, the example embodiments and related embodiments may confer certain benefits including, for instance, reducing or preventing stresses in the vicinity of a solder bump; that is, at the interface between the solder bump and a substrate to which it is bonded, and/or in an underlying semiconductor die, when compared with bonding solder bumps to substrates using metalized pads fabricated according to previous approaches (e.g., as illustrated and described above in FIGS. 1A-1C and FIG. 2). In particular the process of bonding a solder bump to metalized pad as shown in FIG. 2 tends to induce cracks that originate at the edges of the metalized pad. Metalized pads according to embodiments herein described below can enable reduced peeling stresses at the interface between a solder bump and a metalized pad, thereby reducing the incidence of crack formation induced between solder bump and a semiconductor die or other device substrate.

FIG. 3A shows plan view a cross-sectional schematic view of an example structure 300A according to embodiments herein. In the example structure 300A, a substrate 310 (e.g., a substrate 110/210) includes one or more contacts 320 (e.g., a metal contact electrically coupled to one or more electronic devices within the substrate 310). Each contact 320 (and other structures on or near the surface 315 of the substrate 310) are protected by a first electrically insulating material (which may be referred to as a "passivation," "passivation material," or a "passivation layer" 330) and a second electrically insulating material 332A (which may be referred to as a "repassivation," "repassivation material," or a repassivation material" 332A). The repassivation material 332A forms a substantially planar surface 335 above the top surface 315 of the substrate 310. One or more metalized pads 340A are disposed within the substantially planar surface 335 and are electrically coupled to a corresponding contact 320 through an aperture in the passivation material 330 and the repassivation material 332A. As shown, the metalized pad 340A is surrounded by the repassivation material 332A and is coplanar with the repassivation material 332A along an outer boundary region that is partially defined by the diameter 352A relative to a central region 349A defined by the dimension 352A. As shown the metalized pad 340A is recessed below the planar surface 335 of the repassivation material 332A within the central region 349A above the contact 320 indicated by the dimension 354A. However, it will be appreciated that, in one or more related embodiments, the recessed area is not required.

FIG. 3B shows plan view a cross-sectional schematic view of an example structure 300B that is an alternative to the structure 300A in one or more embodiments. In the structure 300B, the metalized pad 340B is patterned inversely to the metalized pad 340A. That is, the metalized pad 340B surrounds a central area 349B (indicated by the dimension 352B) where the metallization is absent and includes an interior region in which the metalized pad 340B and the repassivation material 332B (e.g., the repassivation material 332A). When compared to the structure 300A, the structure 300B may have lower thermal and electrical conductivity, making it suitable for applications in which thermal power dissipation is lower compared to applications for which the structure 300A is suited. It will be understood that, in one or more embodiments, repassivation material (e.g., the repassivation material 332B) and an adjacent portion of a metalized pad (e.g., the metalized pad 340B) are recessed below the substantially planar surface 335, as depicted in the cross-sectional view in FIG. 3B of the structure 300B. As above, it will be appreciated that, in one or more related embodiments, the recessed area is not required.

The passivation material 330 and the repassivation material(s) 332A,332B may be any suitable materials. In one or more embodiments, the passivation material is a crystalline, semicrystalline, or amorphous oxide or nitride material (e.g., SiO2, SiOX where x is a number other than two, Si3N4, or Si3NX where x is a number other than four, as nonlimiting examples). In one or more embodiments, the repassivation material 332A or the repassivation material 332B is a dielectric material with a low elastic modulus compared to the elastic modulus of the repassivation material 332 (e.g., polyimide, polybenzoxazole, etc., as nonlimiting examples). Similarly, the metalized pads 340A, 340B may be formed from any suitable materials and by any suitable process(es). In one or more embodiments, metalized pads 340A or 340B have a metal surface that is wettable by one or more solder materials (i.e., the surface is "solderable"). In one or more embodiments, metalized pads 340A or 340B are formed by a stack of two or more electrically conductive materials. In one example, a metalized pad may include one or more conductive adhesion layers (e.g., Ti, Ni, Ti/Cr as nonlimiting examples) covered by another conductive material such as Cu or Au, as nonlimiting examples. In general, the topmost metallization material which will contact a solder bump may be chosen to have favorable properties such as being easily wetted by a chosen solder material in a molten state.

Figure 4:
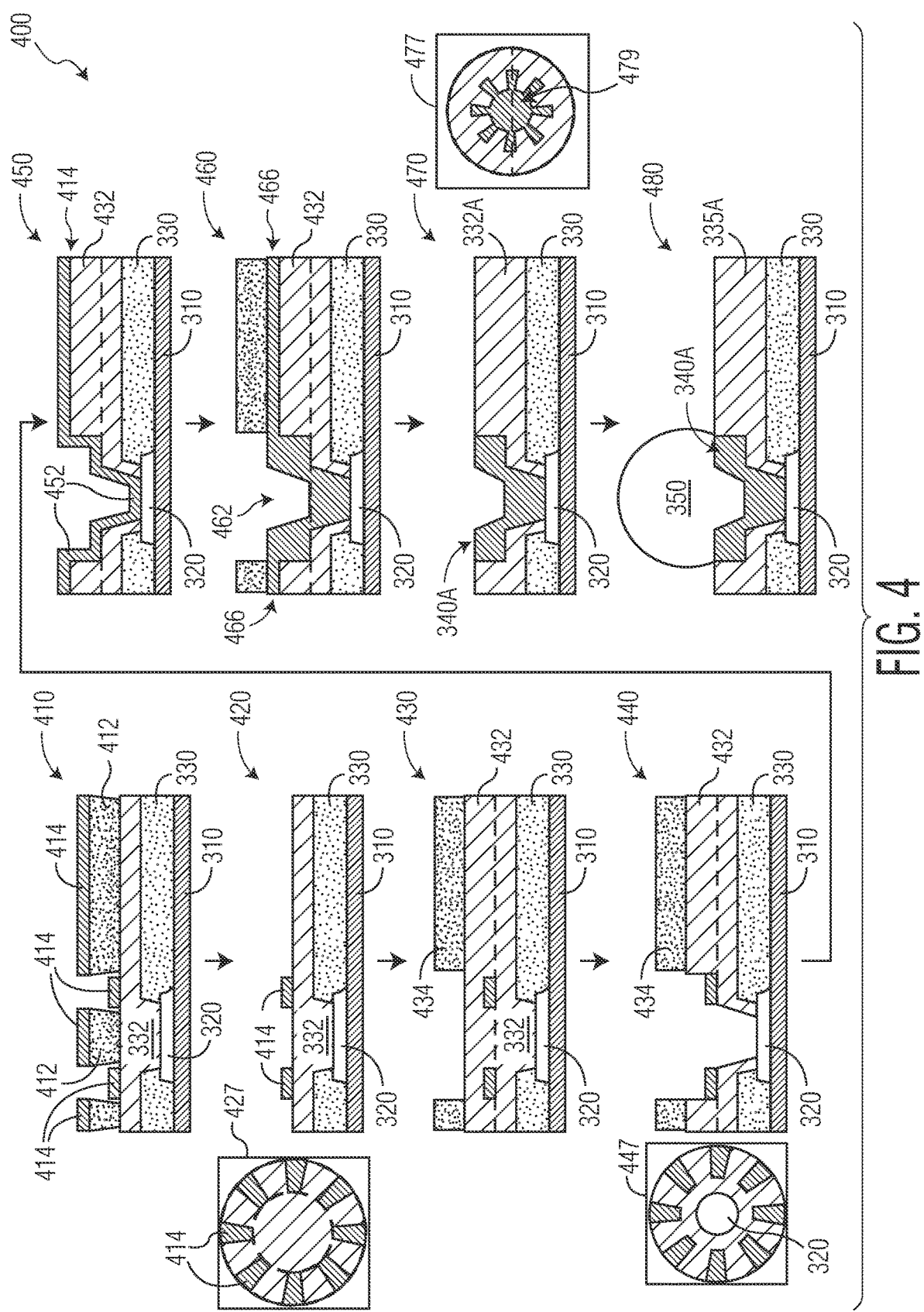
FIG. 4 is flow diagram illustrating a formation of the metalized pad of FIG. 4 during various steps in an example fabrication process according to embodiments herein.

FIG. 4 illustrates formation of the structure 300A on the substrate 110 during various steps of an example process 400 having steps 410, 420, 430, 440, 450, 460, 470, and 480. At step 410, the substrate 310 is shown already provided with contact pads 320, the passivation material 330 and the repassivation material 332. These contact pads 320 may be any suitable conductive material (e.g., aluminum, copper, gold, etc.) and may be coupled to vias in the substrate 310 or exposed electrical traces on the surface of the substrate 310. In the example of step 410, a masking material 412 (e.g., photoresist) is deposited on top of the repassivation material 332 and patterned as shown. A seed metallization layer 414 (e.g., Ti followed by Ni) is deposited over patterned masking material 412 (e.g., photoresist).

At step 420, the seed metallization 414 is patterned in a subtractive lift-off process in which the masking material 412 is removed (e.g., by a solvent rinse), leaving the seed metallization 414 only on desired portions of the substrate 310. It will be understood that even though a lift-off process is described for the patterning of the seed metallization 414, any suitable process may be used, including a subtractive process wherein the seed metallization is deposited over the entire surface and then substantively patterned (by an etching process, for example). An inset top view 427 of step 420 is also shown, indicating the positioning of the seed metallization 414.

At step 430, additional repassivation material 432 is deposited on the substrate 310 followed by a masking material 434 (e.g., photoresist) which is patterned as shown.

At step 440, a suitable etching process (e.g., one which does not appreciably etch the seed metallization 414 or etches the seed metallization 414 at a much slower rate than it etches the additional repassivation material 432 and the repassivation material 332) is used to etch portions of the additional repassivation material 432 and the repassivation material 332 leaving an aperture in the repassivation material 332 within which the contact pad 320 is exposed. An inset top view 447 of step 440 is also shown, indicating the positioning of the exposed contact 320 relative to the seed metallization 414.

At step 450, the masking material 434 has been removed and additional seed metallization material 414 or other suitable metallization material is deposited as metallization material 452 over the initial seed metallization material 414. As an example, the metallization material 422 may deposited via electroplating, sputtering, or evaporation to a desired thickness.

At step 460, another masking material 464 (e.g., photoresist) is deposited and patterned, as shown. Additional metallization material 462 may then be deposited in a pattern defined by the masking material 464 using any suitable process including electroplating, sputtering, or thermal evaporation, as nonlimiting examples.

At step 470, the masking material 464 is removed and the residual seed metallization 414, which was previously protected by the masking material 464 (shown as the residual metal 466 in step 460), is removed using any suitable process including wet chemical etching, dry plasma etching, or chemical-mechanical polishing, as nonlimiting examples, resulting in the metalized pad 340A, which is coplanar (or substantially coplanar) with the repassivation 332A along its outer edge and recessed below the plane of the repassivation material 332A as shown in FIG. 3A. The cross-sectional view of step 470 shown corresponds to a plane indicated by the dashed line 479 that bisects the inset top view 477 of step 470.

Finally, at step 480, the solder bump 350 is bonded to the metalized pad 340A by any suitable process. For example, a solid volume of solder may be placed on the metalized pad and heated until the solder wets the metalized pad and then bonds to the pad upon cooling.

Figure 5:
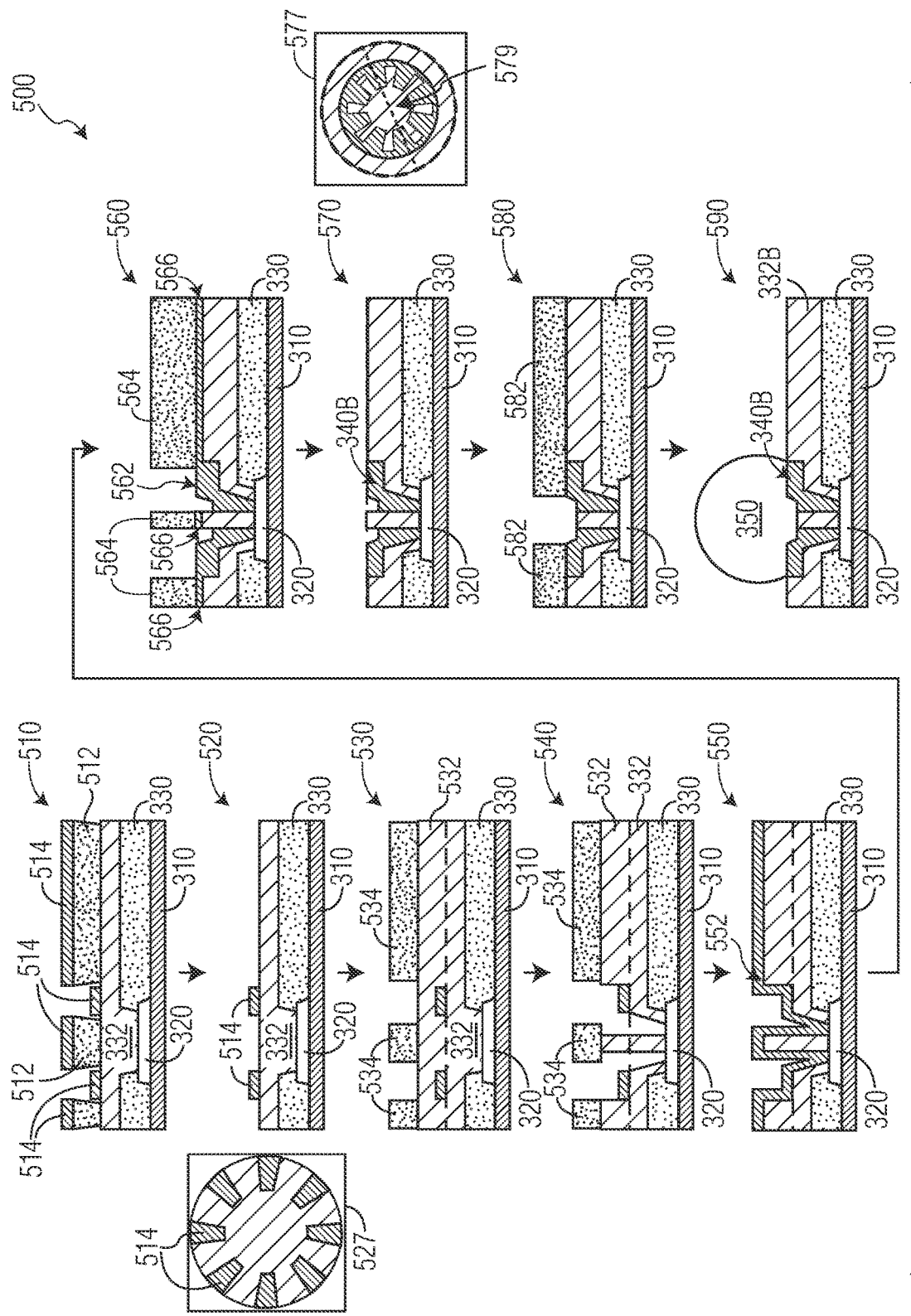
FIG. 5 is a flow diagram illustrating a formation of the metalized pad of FIG. 5 during various steps in an example fabrication process according to embodiments herein.

FIG. 5 illustrates formation of the structure 300B on the substrate 310 during various steps of an example process 500 having steps 510, 520, 530, 540, 550, 560, 570, and 580. At step 510, the substrate 310 is shown already provided with contact pads 320, the passivation material 330 and the repassivation material 332. In the example of step 510, a masking material 512 (e.g., masking material 412) is deposited on top of the repassivation material 332 and patterned as shown. A seed metallization layer 514 (e.g., the seed metallization 414) is deposited over the patterned masking material 512.

At step 520 (e.g., the step 420 of the process 400), the seed metallization 514 is patterned in a subtractive lift-off process in which the masking material 512 is removed, leaving the seed metallization 414 only on desired portions of the substrate 310. It will be understood that even though a lift-off process is described for the patterning of the seed metallization 414, any suitable process may be used, including a subtractive process wherein the seed metallization is deposited over the entire surface and then substantively patterned (by an etching process, for example). An inset top view 527 of step 520 is also shown, indicating the positioning of the seed metallization 514.

At step 530, additional repassivation material 532 (e.g., the additional repassivation material 432) is deposited on the substrate 310 followed by deposition of a masking material 532 (the masking material 432) which is patterned as shown. In contrast to step 430 of the process 400, the masking material 534 in step 530 covers the seed metallization 514 and also an area between the two areas of seed metallization 514.

At step 540, a suitable etching process is used to etch portions of the additional repassivation material 532 and the repassivation material 332 (e.g., as previously described in connection with step 440 of the process 400) leaving apertures in the repassivation material 332 within which the contact pad 320 is exposed.

At step 550, the masking material 534 is removed and additional seed metallization material 514 or another additional metallization material is deposited over initial seed metallization 514 as the metallization material 552. As an example, metallization material 514 or metallization material 552 may deposited via electroplating, sputtering, or evaporation to a desired thickness, as previously described in connection with step 450 of the process 400.

At step 560, another masking material 564 (e.g., the masking material 464 of the process 400) is deposited and patterned, as shown. Additional metallization material 562 may then be deposited in a pattern defined by the masking material 564 using any suitable process, as previously described in connection with step 460 of the process 400.

At step 570, the masking material 562 is removed and the residual seed metallization 414, which was previously protected by the masking material 464 (shown as the residual metal 566 in step 560), is removed using any suitable process including wet chemical etching, dry plasma etching, or chemical-mechanical polishing, as nonlimiting examples, resulting in the metalized pad 340B which is coplanar with the repassivation 332B along its outer edge and recessed below the plane of the repassivation material 332B as shown in FIG. 3B. The cross-sectional view of step 570 shown corresponds to a plane indicated by the dashed line 579 that bisects the inset top view 577 of step 570.

At step 580, masking material 582 (e.g., photoresist) is patterned over the center of the metalized pad 340B and the additional repassivation material 532 in that region is partially removed using any suitable process (e.g., wet etching, or dry plasma etching as nonlimiting examples) to create the recessed profile of the shown in which the additional repassivation material 532 is substantially coplanar with the surrounding recessed portion of the metalized pad 340B. It will be appreciated that, in one or more embodiments, the recessed profile shown can be achieved in any suitable manner including performing the step 580 or a similar step at a different point in the process 500. For example, the additional repassivation material 532 could be patterned immediately after step 540 as one non-limiting example.

Finally, at step 590 (e.g., the step 480 of the process 400), after the masking material 582 has been removed, the solder bump 350 is bonded to the metalized pad 340B by any suitable process, as previously described in connection with step 480 of the process 400.

It will further be appreciated that, in or more embodiments, modifications to various steps shown may be employed. For instance, at step 510, the masking material 512 may be patterned such that an additional segment of the seed metallization 514 is present on the surface of the repassivation material 332 at subsequent steps 520, 530, and 540.

It will also be appreciated that although processes 400 and 500 as shown in FIG. 4 and FIG. 5, respectively are described as having various patterning steps which involve patterning one or masking materials (e.g., photoresist) that, in some instances, areas of the repassivation material (e.g., additional repassivation material 432, 532 and/or repassivation material 332) may be patterned directly using known lithographic techniques to selectively cross-link or depolymerize the repassivation materials.

Figure 6A:
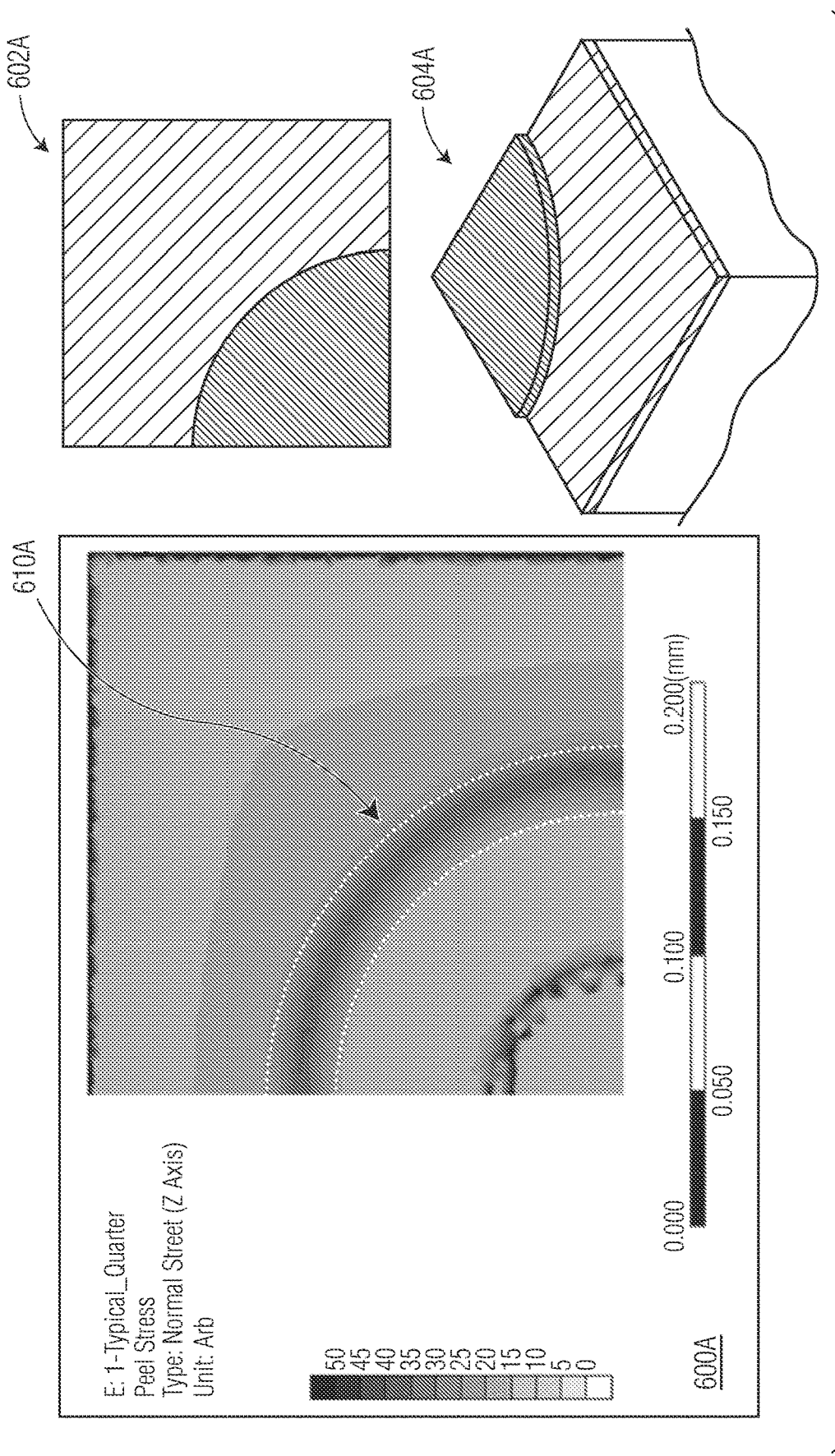
FIG. 6A is a representation of the result of computational simulations of peeling stresses in a conventional metalized pad bonded to a solder bump as shown in FIG. 1A, in a metalized pad without the coplanar arrangement shown in FIG. 3A and FIG. 3B, and in the structure of FIG. 3A according to embodiments herein

FIG. 6A includes a plot 600A showing the result of computational simulations of the peeling stresses (stresses that are concentrated at edges when two materials are bonded together) on the surface of semiconductor provided with a conventionally-shaped metalized pad with a non-planar topography (e.g., a metalized pad 140 as shown in FIG. 1A and FIG. 1B) when a solder ball (e.g., a solder ball 150) is joined to the metalized pads. A concentrated annular area 610A of high peeling stress values can be seen. Note that only one quadrant is simulated, as shown by the schematic top view illustration 602A. An isometric view 604A shows that the simulated structure is not coplanar with the surrounding repassivation material.

Figure 6B:
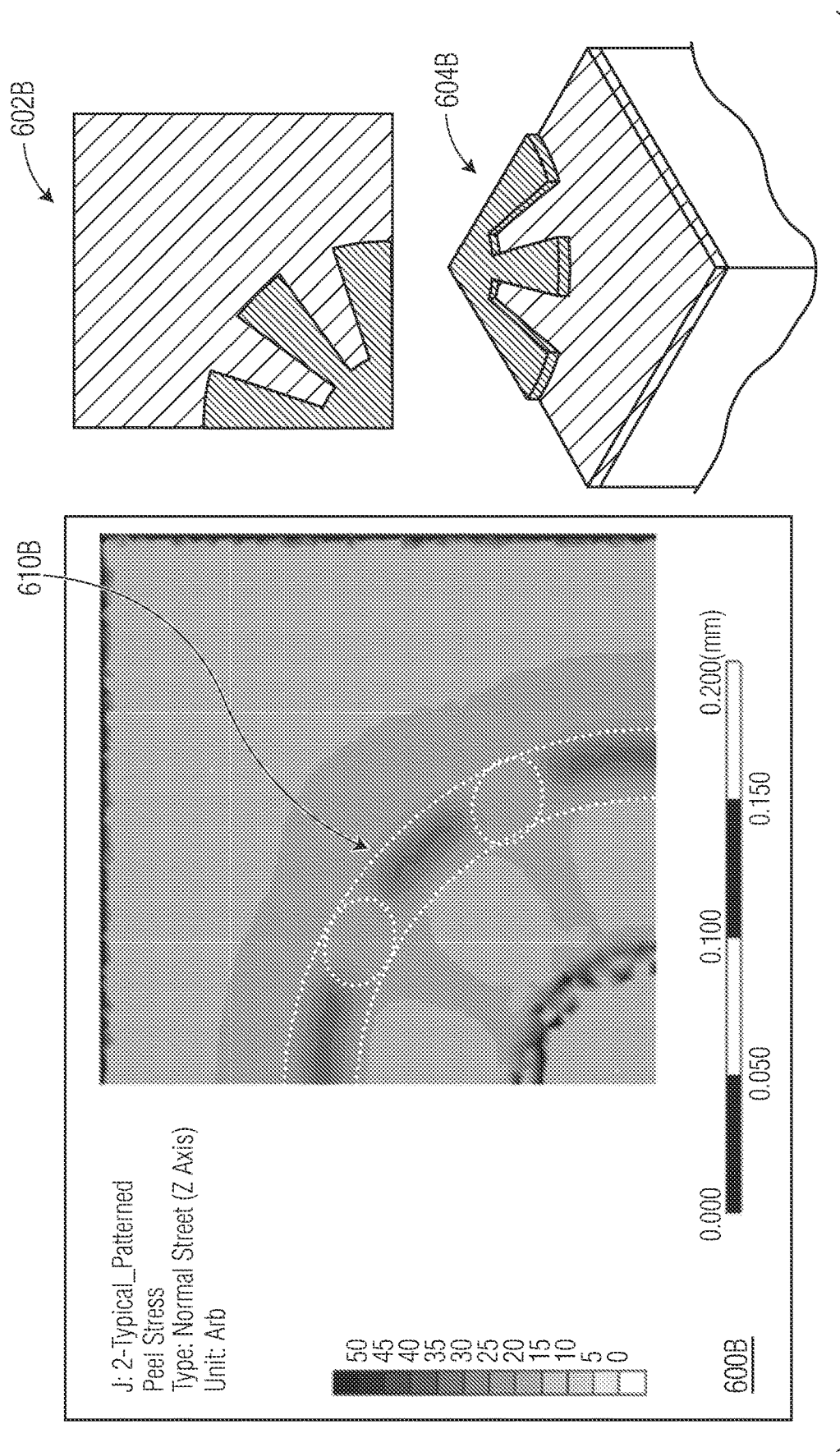
FIG. 6B represents the result of computational simulations of peeling stresses in a metalized pad that has a similar pattern to embodiments herein but lacking the coplanar arrangement shown in FIG. 3A and FIG. 3B, and in the structure of FIG. 3A. according to embodiments herein.

FIG. 6B includes a plot 600B showing the result of computational simulations of the peeling stresses on the surface of semiconductor die provided with metalized pad that is patterned similarly to the metalized pad 340A but without the planarized topography present in embodiments herein (e.g., the metalized pad 340A). Areas of high peeling stresses are present in the annular region 610B (analogous to the annular region 610A), but areas of reduced stress (indicated by dashed ellipses) are seen within the annular region 610B. The peak peeling stress in the simulation represented by the plot 600B is reduced by approximately 7% compared to the simulation represented by the plot of FIG. 6A. As above only one quadrant is simulated, as shown by the schematic top view illustration 602B. An isometric view 604B shows that the simulated pad structure is not coplanar with the surrounding repassivation material.

Figure 6C:
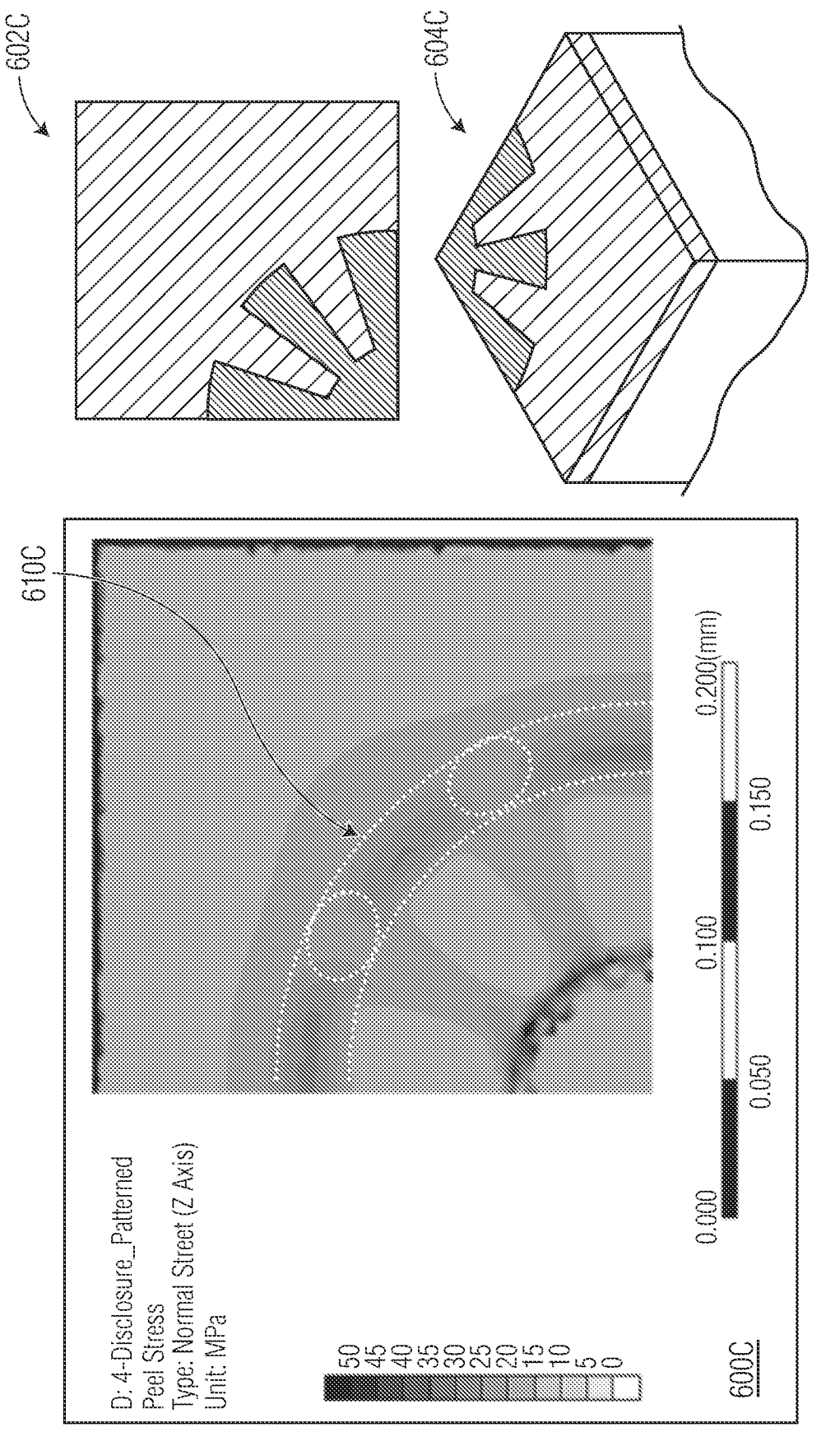
FIG. 6C represents the result of computational simulations of peeling stresses in a metalized pad bonded to a solder bump as shown in FIG. 3A according to embodiments herein which is both patterned and coplanar with the surrounding repassivation material as described herein.

FIG. 6C includes a plot 600C showing the result of computational simulations of the peeling stresses on the surface of semiconductor die provided with a metalized pad according to embodiments herein (i.e., a pad similar to the metalized pad 340A) Areas of high peeling stresses are present in the annular region 610C (analogous to the annular regions 610A and 610B) and areas of reduced stress (indicated by dashed ellipses) are present as in the annular region 610B. But it can be seen that the combination of a shaped metalized pad and coplanarity of the pad with the surrounding repassivation material can result in significantly reduced peak values for the peeling stresses. The peak peeling stress in the simulation represented by the plot 600C of FIG. 6C is reduced by approximately 44% compared to the simulation represented by the plot 600A of FIG. 6A. As above, only one quadrant is simulated, as shown by the schematic top view illustration 602C. An isometric view 604C shows that the simulated pad structure, in contrast to the structures of FIG. 6A and FIG. 6B, is coplanar with the surrounding repassivation material at its outer boundary with the repassivation material.

Figure 7:
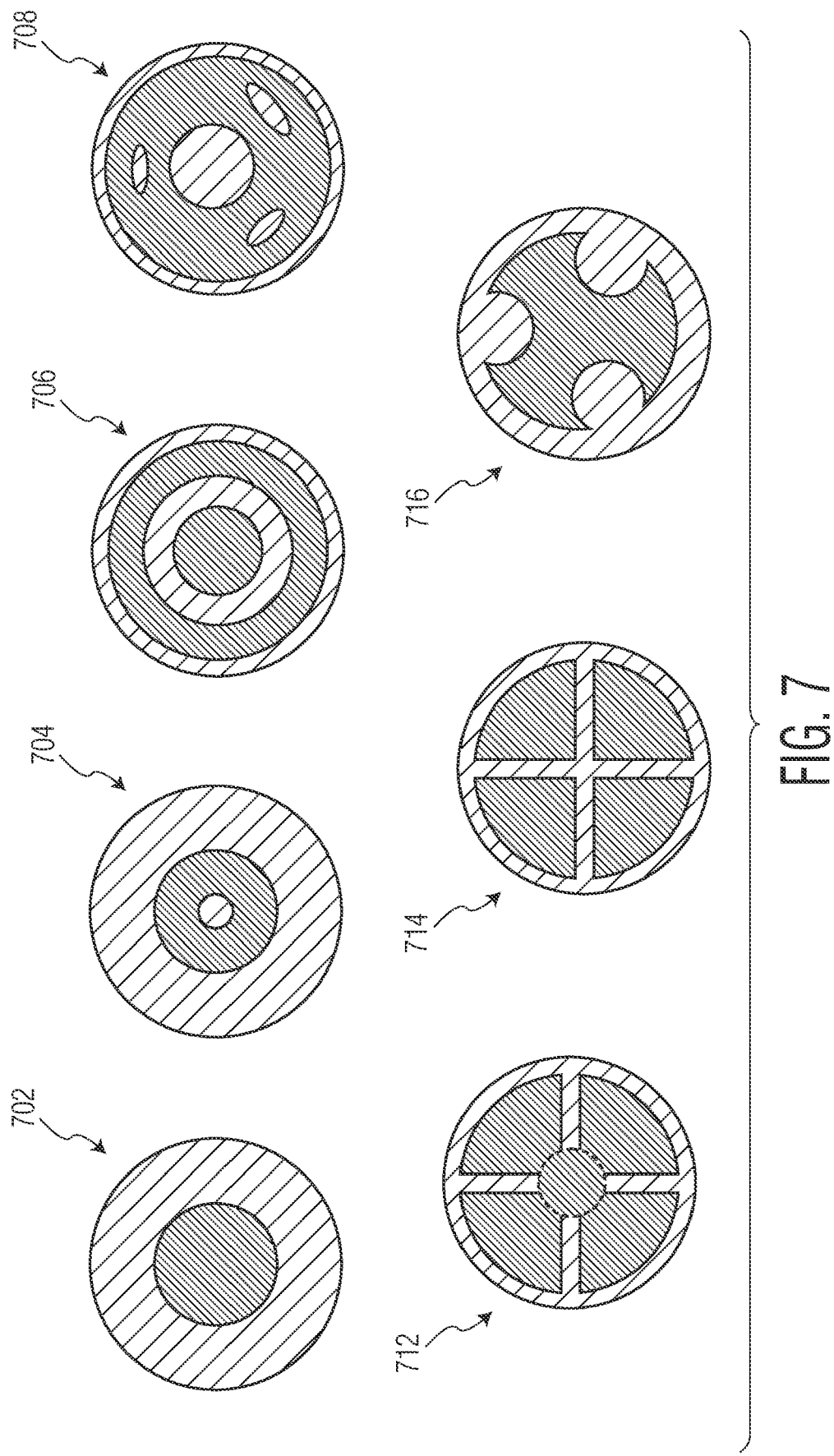
FIG. 7 shows examples of patterned metalized pads suitable for use in embodiments herein.

Although various illustrations and examples herein describe metalized pads that are patterned to have an interdigitated arrangement with a repassivation layer it should be understood that other patterns can be used in one or more embodiments. Non-limiting examples of suitably patterned metalized pads are shown in FIG. 7 and include annular structures 702, 704, and 706; a slotted annular structure 708; a Greek cross 712 and a separated Greek cross 714; and an inverted trefoil 716. It will be understood that nothing herein is intended to limit the topology of metalized pads according to embodiments to any particular number or types of patterns. Additionally, it will be understood that although one or more embodiments may include recessed areas such as those shown in FIG. 3A and FIG. 3B, that in one or more other embodiments, such recessed areas can be omitted.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Features of embodiments may be understood by way of one or more of the following examples:

Example 1: An electronic device substrate includes a repassivation material layer and a metalized pad. The repassivation material layer has a substantially planar surface formed on the substrate from a first electrically nonconductive material and the metalized pad is surrounded by and coplanar with the first electrically nonconductive material along an outer boundary of the metalized pad. The metalized pad has a solderable surface and electrically contacts an electrical contact pad on the substrate beneath the metalized pad.

Example 2: The substrate of Example 1, in which the metalized pad includes metalized fingers that extend radially from the outer boundary of the metalized pad in interdigitated arrangement with the repassivation material layer.

Example 3: The substrate of Example 2 in which the metalized fingers of the metalized pad extend radially outward from a central portion of the metalized pad.

Example 4: The substrate of any of Examples 1-3, in which the metalized pad includes a recessed portion inside the outer boundary that is recessed below the substantially planar surface.

Example 5: The substrate of any of Examples 2-4, in which the metalized fingers of the metalized pad extend radially inward from the outer boundary of the metalized pad toward a central region formed from the first electrically nonconductive material of the repassivation material layer.

Example 6: The substrate of Example 5, in which a portion of each metalized finger includes a recessed portion inside the outer boundary that is recessed below the substantially planar surface. The central region formed from the first electrically nonconductive material of the repassivation material layer is also recessed below the substantially planar surface and is substantially coplanar with the recessed portion of each metalized finger.

Example 7: The substrate of any of Examples 1-6, in which the metalized pad includes a recessed portion inside the outer boundary that is recessed below the substantially planar surface.

Example 8: The substrate of any of Examples 1-7. The electronic device substrate of claim 2, further comprising a passivation material layer formed from a second electrically nonconductive material underlying the substantially planar surface of the repassivation material layer.

Example 9: The substrate of Example 8, in which the first electrically nonconductive material is a polymeric material characterized by a first elastic modulus and the second electrically nonconductive material is characterized by a second elastic modulus that is higher than the first elastic modulus.

Example 10: The substrate of any of Examples 1-9, further including an electrically conductive contact beneath the metalized pad. The metalized pad is electrically coupled to the electrically conductive contact within an aperture that passes through the repassivation material layer and the passivation material layer.

Example 11: The substrate of any of Examples 1-10 wherein the metalized pad and first electrically nonconductive material of the repassivation material are jointly configured and arranged such that mechanical strain in the metallized pad is at least partially relieved by elastic deformation of the repassivation material layer.

Example 12: A method of fabricating an electronic device substrate that includes forming a repassivation material layer having a substantially planar surface on a substrate from a first electrically nonconductive material above a substrate having an electrical contact pad. The method further includes. The method further includes forming an aperture in the repassivation material layer that exposes an electrical contact pad on the substrate. The method further includes forming, within the aperture, a metalized pad that is surrounded by and coplanar with the repassivation material layer along an edge of the aperture, wherein the metalized pad has a solderable surface and electrically contacts the electrical contact pad.

Example 13: The method of Example 12, in which forming the metalized pad includes forming metalized fingers that extend radially from an outer boundary of the metalized pad in an interdigitated arrangement with the repassivation material layer.

Example 14: The method of Example 13, in which the metalized fingers of the metalized pad extend radially outward from a central portion of the metalized pad.

Example 15: The method of Example 14 or Example 13, in which forming the metalized pad includes forming a recessed portion of the metalized pad inside the outer boundary that is recessed below the substantially planar surface.

Example 16: The method of any of Examples 13-15, further including forming a central region from the first electrically nonconductive material of the repassivation material layer. In this example, the metalized fingers of the metalized pad extend radially inward from the outer boundary of the metalized pad toward a central region formed from the first electrically nonconductive material of the repassivation material layer.

Example 17: The method of any of Examples 13-16, in which forming the metalized fingers includes forming a recessed portion of each metalized finger that is recessed below the substantially planar surface and disposed inside the outer boundary. In this example, the central region formed from the first electrically nonconductive material of the repassivation material layer is also recessed below the substantially planar surface and is coplanar with the recessed portion of each metalized finger.

Example 18: The method of any of Examples 12-17, in which forming the metalized pad includes forming a recessed portion of the metalized pad that is recessed below the substantially planar surface and disposed inside the outer boundary.

Example 19: The method of any of Examples 12-18 in which the repassivation material layer is formed over a passivation material layer on the substrate formed from a second electrically nonconductive material. The first electrically nonconductive material is a polymeric material characterized by a first elastic modulus and the second electrically nonconductive material characterized by a second elastic modulus that is higher than the first elastic modulus. This example further includes jointly configuring and arranging the metalized pad and the first electrically nonconductive material of the repassivation material layer such that mechanical strain in the metallized pad is at least partially relieved by elastic deformation of the repassivation material layer.

Example 20: The method of any of Examples 12-19, further including electrically coupling the metalized pad to the electrical contact pad within the aperture that passes through the repassivation material layer.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. An electronic device substrate comprising:
   a repassivation material layer having a substantially planar surface formed on the substrate from a first electrically nonconductive material; and
   a metalized pad surrounded by and coplanar with the first electrically nonconductive material along an outer boundary of the metalized pad;
   wherein the metalized pad has a solderable surface and electrically contacts an electrical contact pad on the substrate beneath the metalized pad; and
   wherein the metalized pad includes metalized fingers that extend radially from the outer boundary of the metalized pad in interdigitated arrangement with the repassivation material layer.

2. The electronic device substrate of claim 1, wherein the metalized fingers of the metalized pad extend radially outward from a central portion of the metalized pad.

3. The electronic device substrate of claim 2,
wherein the metalized pad includes a recessed portion inside the outer boundary that is recessed below the substantially planar surface.

4. The electronic device substrate of claim 1,
wherein the metalized fingers of the metalized pad extend radially inward from the outer boundary of the metalized pad toward a central region formed from the first electrically nonconductive material of the repassivation material layer.

5. The electronic device substrate of claim 4,
wherein a portion of each metalized finger includes a recessed portion inside the outer boundary that is recessed below the substantially planar surface; and
wherein the central region formed from the first electrically nonconductive material of the repassivation material layer is also recessed below the substantially planar surface and is substantially coplanar with the recessed portion of each metalized finger.

6. The electronic device substrate of claim 1,
wherein the metalized pad includes a recessed portion inside the outer boundary that is recessed below the substantially planar surface.

7. The electronic device substrate of claim 1, further comprising a passivation material layer formed from a second electrically nonconductive material underlying the substantially planar surface of the repassivation material layer.

8. The electronic device substrate of claim 7, further comprising an electrically conductive contact beneath the metalized pad;
wherein the metalized pad is electrically coupled to the electrically conductive contact within an aperture that passes through the repassivation material layer and the passivation material layer.

9. The electronic device substrate of claim 7,
wherein the first electrically nonconductive material is a polymeric material characterized by a first elastic modulus; and
wherein the second electrically nonconductive material is an inorganic material characterized by a second elastic modulus that is higher than the first elastic modulus.

10. The electronic device substrate of claim 9, further comprising:
wherein the metalized pad and first electrically nonconductive material of the repassivation material are jointly configured and arranged such that mechanical strain in the metallized pad is at least partially relieved by elastic deformation of the repassivation material layer.

11. A method of fabricating an electronic device substrate, comprising:
forming a repassivation material layer having a substantially planar surface on a substrate from a first electrically nonconductive material above a substrate having an electrical contact pad;
forming an aperture in the repassivation material layer that exposes an electrical contact pad on the substrate; and
forming, within the aperture, a metalized pad that is surrounded by and coplanar with the repassivation material layer along an edge of the aperture, wherein the metalized pad has a solderable surface and electrically contacts the electrical contact pad;
wherein forming the metalized pad includes forming metalized fingers that extend radially from an outer boundary of the metalized pad in an interdigitated arrangement with the repassivation material layer.

12. The method of claim 11,
wherein the metalized fingers of the metalized pad extend radially outward from a central portion of the metalized pad.

13. The method of claim 12,
wherein forming the metalized pad includes forming a recessed portion of the metalized pad inside the outer boundary that is recessed below the substantially planar surface.

14. The method of claim 11,
wherein the method further comprises forming a central region from the first electrically nonconductive material of the repassivation material layer; and
wherein the metalized fingers of the metalized pad extend radially inward from the outer boundary of the metalized pad toward a central region formed from the first electrically nonconductive material of the repassivation material layer.

15. The method of claim 14,
wherein forming the metalized fingers includes forming a recessed portion of each metalized finger that is recessed below the substantially planar surface and disposed inside the outer boundary; and
wherein the central region formed from the first electrically nonconductive material of the repassivation material layer is also recessed below the substantially planar surface and is coplanar with the recessed portion of each metalized finger.

16. The method of claim 11, wherein forming the metalized pad includes forming a recessed portion of the metalized pad that is recessed below the substantially planar surface and disposed inside the outer boundary.

17. The method of claim 11,
wherein the repassivation material layer is formed over a passivation material layer on the substrate from a second electrically nonconductive material;
wherein the first electrically nonconductive material is a polymeric material characterized by a first elastic modulus; and
wherein the second electrically nonconductive material is characterized by a second elastic modulus that is higher than the first elastic modulus; and
wherein the method further comprises jointly configuring and arranging the metalized pad and first electrically nonconductive material of the repassivation material layer such that mechanical strain in the metallized pad is at least partially relieved by elastic deformation of the repassivation material layer.

18. The method of claim 17, further comprising electrically coupling the metalized pad to the electrical contact pad within the aperture that passes through the repassivation material layer.

* * * * *